(12) United States Patent
Seshadri et al.

(10) Patent No.: US 7,200,027 B2
(45) Date of Patent: Apr. 3, 2007

(54) FERROELECTRIC MEMORY REFERENCE GENERATOR SYSTEMS USING STAGING CAPACITORS

(75) Inventors: Anand Seshadri, Plano, TX (US); Jarrod R. Eliason, Colorado Springs, CO (US); Sudhir Kumar Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 128 days.

(21) Appl. No.: 11/100,013

(22) Filed: Apr. 6, 2005

(65) Prior Publication Data

US 2006/0140017 A1 Jun. 29, 2006

Related U.S. Application Data

(63) Continuation-in-part of application No. 11/024,530, filed on Dec. 29, 2004, now abandoned.

(51) Int. Cl.
*G11C 11/22* (2006.01)

(52) U.S. Cl. .................. 365/145; 365/210; 365/189.09
(58) Field of Classification Search ................ 365/145, 365/210, 203, 189.09
See application file for complete search history.

(56) References Cited

U.S. PATENT DOCUMENTS

| | | | |
|---|---|---|---|
| 4,081,701 A | 3/1978 | White, Jr. et al. | |
| 4,716,320 A | 12/1987 | McAdams | |
| 5,029,136 A | 7/1991 | Tran et al. | |
| 5,424,975 A | 6/1995 | Lowrey et al. | |
| 5,694,353 A * | 12/1997 | Koike | 365/145 |
| 5,754,466 A * | 5/1998 | Arase | 365/145 |
| 5,790,467 A | 8/1998 | Haukness et al. | |
| 5,831,919 A | 11/1998 | Haukness et al. | |
| 5,847,989 A | 12/1998 | Seyyedy | |
| 5,959,922 A | 9/1999 | Jung | |
| 6,078,530 A * | 6/2000 | Choi | 365/189.09 |
| 6,295,223 B1 * | 9/2001 | Choi et al. | 365/145 |
| 6,347,059 B2 | 2/2002 | Böhm et al. | |
| 6,392,916 B1 * | 5/2002 | Choi et al. | 365/145 |
| 2001/0024396 A1 | 9/2001 | Bohm et al. | |
| 2001/0038557 A1 | 11/2001 | Braun et al. | |
| 2004/0001378 A1 | 1/2004 | Madan et al. | |
| 2004/0141353 A1 | 7/2004 | Madan | |
| 2004/0174750 A1 | 9/2004 | Eliason et al. | |

* cited by examiner

*Primary Examiner*—Anh Phung
(74) *Attorney, Agent, or Firm*—Jacqueline J. Garner; W. James Brady, III; Frederick J. Telecky, Jr.

(57) ABSTRACT

Reference generator systems (108, 130) and methods (200) are presented for providing bitline reference voltages for memory access operations in a ferroelectric memory device (102). The reference generator system (108, 130) comprises a primary capacitance (130), a precharge system (132) that charges the primary capacitance, and a reference system (108) with a plurality of local reference circuits (108a) associated with corresponding array columns that individually comprise a staging capacitance (Cs), a first switching device (S1) coupled between the staging capacitance and the primary capacitance (130), and a second switching device (S2, S3) coupled between the staging capacitance (Cs) and a bitline of the corresponding array column. The first switching device (S1) couples the staging capacitance (Cs) to the precharged primary capacitance (130) and then isolates the precharged staging capacitance (Cs) from the primary capacitance (130), and the second switching device (S2, S3) isolates the staging capacitance (Cs) from the bitline while the staging capacitance Cs is coupled to the primary capacitance (130), and then couples the precharged staging capacitance (Cs) to the bitline to provide a reference voltage to the bitline during the memory access operation.

21 Claims, 8 Drawing Sheets

FERROELECTRIC MEMORY REFERENCE GENERATOR SYSTEMS USING STAGING CAPACITORS

REFERENCE TO RELATED APPLICATION

This application is a continuation-in-part application of U.S. application Ser. No. 11/024,530 which was filed Dec. 29, 2004, now abandoned entitled FERROELECTRIC MEMORY REFERENCE GENERATOR SYSTEMS USING STAGING CAPACITORS.

FIELD OF INVENTION

The present invention relates generally to semiconductor devices and more particularly to improved apparatus and methods for reference voltage generation in ferroelectric memory devices.

BACKGROUND OF THE INVENTION

In semiconductor devices, such as integrated circuits, memory is used for storing data, program code, or other information. Ferroelectric memory devices are integrated circuits (ICs), such as dedicated memories or other ICs, in which data is stored in ferroelectric cell capacitors, where the memory cells are commonly organized in single-transistor, single-capacitor (1T1C) or two-transistor, two-capacitor (2T2C) configurations. In a typical folded bitline 1T1C architecture, the individual ferroelectric memory cells include a ferroelectric (FE) capacitor adapted to store a binary data bit, together with a MOS access transistor, which operates to selectively connect the FE capacitor to one of a pair of complementary bitlines associated with an array column, with the other bitline being connected to a reference voltage for memory read operations. The memory cells are commonly organized as individual bits of a corresponding data word, where the cells of a given word are accessed concurrently along a selected array row through activation of corresponding platelines and wordlines by address decoding control circuitry.

Ferroelectric memory devices provide non-volatile data storage, wherein the memory cell capacitors are constructed using ferroelectric dielectric material that may be polarized in one direction or another in order to store a binary value. The ferroelectric effect in such cell capacitors allows for the retention of a stable polarization in the absence of an applied electric field due to the alignment of internal dipoles within Perovskite crystals in the ferroelectric material. This alignment may be selectively achieved by controlled application of an electric field between the ferroelectric capacitor terminals that exceeds a coercive field of the material. Reversal of the applied field reverses the internal dipoles, wherein the response of the polarization of a ferroelectric capacitor to the applied voltage may be plotted as a hysteresis curve.

Data in a 1T1C ferroelectric memory cell is read by connecting a reference voltage to a first bitline (a reference bitline), and by connecting the cell capacitor between a complementary bitline (data bitline) and a plateline signal. A plateline pulse signal is then applied, whereby a differential voltage is provided on the bitline pair, which is connected to a differential sense amp circuit. The reference voltage is typically supplied at an intermediate voltage between the voltage associated with a ferroelectric capacitor storing a binary "0" and that of the capacitor storing a binary "1". The sensed differential voltage is buffered by the sense amp and provided to a pair of local IO lines, where the polarity of the differential voltage represents the data that was stored in the cell. The transfer of data between the ferroelectric memory cell, the sense amp circuit, and the local data bitlines is controlled by various access transistors, typically MOS devices, with switching signals being provided by control circuitry including address decoders and timing circuits in the device.

Connection of the ferroelectric cell capacitor between the plateline pulse and the bitline during a read operation causes an electric field to be applied to the cell capacitor. If the field is applied in a direction to switch or reverse the internal dipoles, more charge will be moved than if the dipoles are not reversed. As a result, the sense amplifier can measure the charge applied to the cell bitlines and produce either a logic "1" or "0" differential voltage at the sense amp terminals. Since reading the cell data is a destructive operation, the sensed data is then restored to the target memory cell following each read operation. To write data to the cell in a restore or data write operation, an electric field is applied to the cell capacitor by a sense amp or write buffer to polarize it to the desired state. Ferroelectric memories provide certain performance advantages over other forms of non-volatile data storage devices, such as flash and EEPROM type memories. For example, ferroelectric memories offer short programming (e.g., write access) times and low power consumption, and allow a relatively high number of write operations compared with flash and EEPROM memories.

Ferroelectric memory devices typically include a number of individually addressable memory cells arranged in an array configuration, wherein the array is typically organized as a matrix of rows and columns. Conventionally, data is stored into a memory array as a row, and read out from the memory array as a row, where the row typically consists of 8, 16, 32, or 64 bits of binary data. During a read, write, or restore memory access operation, control circuitry provides a plateline pulse signal to the first sides of the ferroelectric cells in a target array row, the other sides of which are connected to the array bitlines to provide or receive the data. In a read operation, the decoder provides plateline pulses to the first side of each ferroelectric memory cell in a target array row, and sense amplifiers are connected to the other side of the cells to sense a row of stored data bits in parallel fashion. A signal level $V_1$ or $V_0$ is thus obtained on the data bitline (e.g., the bitline coupled with the accessed cell), depending upon the state of the data being read (e.g., binary "1" or "0", respectively), where the reference voltage on the other bitline is a voltage in between $V_1$ and $V_0$. The sense amp for each array column then amplifies (latches) the differential voltage on the complementary bitline pair. Thus, in a single memory access operation, an entire row of data bits (e.g., 8, 16, 32, or 64 bits) are obtained from the memory cells in the selected row, and the data is then provided from the sense amps to local IO circuitry. In write and restore operations, the sense amps provide the data on the bitlines and a plateline pulse is applied to the cell capacitors, whereby the data is written to the cell capacitors of the selected array row.

Thusfar, two types of reference generation schemes have been employed to provide the bitline reference voltage for read operations in ferroelectric memory devices. In the first type, a single reference generator is common to (e.g., shared by) several columns, which may be all the columns of a certain segment or other portion of the array, or a single reference generator may be shared among all the columns. A problem with this approach is that several reference bitlines are shorted together through the common reference generator during read operations. In this situation, a bad column cannot be distinguished or isolated from other (e.g., presumably good) columns, thus making replacement or substitution impossible for a single bad column where column redundancy is employed. Furthermore, a single bad column may corrupt the value of the reference voltage allied to all the columns, thereby rendering the entire array or a portion thereof unusable.

In a second approach, a separate (e.g., dedicated) reference generator is provided for each column. However, several challenges are presented in implementing the second approach, including reliability, area utilization, and power consumption. In particular, separate reference generators occupy a large amount of device area and consume a larger amount of power than do shared reference generators. Accordingly, there remains a need for improved reference generator systems and methods for providing reference voltages for ferroelectric memory devices, by which the above and other shortcomings of the prior art may be mitigated or overcome.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later. The invention relates to ferroelectric memory devices and reference generators therefor, as well as methods for providing bitline reference voltages for memory access operations in a ferroelectric memory device.

One aspect of the invention relates to ferroelectric memory devices and a reference generator system thereof for providing bitline reference voltages for memory access operations in a ferroelectric memory device. The reference generator system comprises a primary capacitance, a precharge system coupled with the primary capacitance, and a reference system comprising a plurality of local reference circuits individually associated with a corresponding array column of a ferroelectric memory array. The precharge system charges the primary capacitance to a primary precharge voltage during a memory access operation, and the precharged primary capacitance is coupled with staging capacitances of the local references to precharge the staging capacitances. The precharged staging capacitances are then isolated from the primary capacitance and coupled to array bitlines to provide the local reference voltages during the memory access. The staging capacitors may be isolated from the array bitlines during precharging, whereby a bad column or bitline will not corrupt the value of the reference voltage. Moreover, the reference generator system of the invention facilitates reduced circuit area compared with dedicated reference generator schemes.

In one implementation, the local reference circuits individually comprise a staging capacitance, along with first and second switching devices, where the primary capacitance and the staging capacitances may be any type of capacitance, including ferroelectric and/or non-ferroelectric types. The first switching device is coupled between the staging capacitance and the primary capacitance, and is adapted to couple the staging capacitance to the precharged primary capacitance for charge sharing therebetween to precharge the staging capacitance to a stage precharge voltage, and to then isolate the precharged staging capacitance from the primary capacitance during the memory access operation. In one example, the first switching device also initially isolates the staging capacitance from the primary capacitance while the precharge system charges the primary capacitance. In another example, the first switching device couples the staging capacitance to the primary capacitance while the precharge system charges the primary capacitance so that both the staging capacitances and the primary capacitance are precharged concurrently. The reference generator system may also comprise a reference bus coupled between the primary capacitance and the first switching devices. The second switching device is coupled between the staging capacitance and a bitline of the corresponding array column, wherein the second switching device is adapted to isolate the staging capacitance from the bitline while the staging capacitance is coupled to the precharged primary capacitance. The second switching device then couples the precharged staging capacitance to one of the array column bitlines for charge sharing therebetween to provide a reference voltage to the bitline during the memory access operation.

The primary capacitance may comprise any type of capacitor or capacitors, such as ferroelectric or non-ferroelectric capacitances. In one implementation, the primary capacitance comprises a plurality of primary capacitors, and the precharge system comprises first and second switching systems coupled with the primary capacitors. In this example, the first switching system selectively couples the individual primary capacitors to one of a first voltage level and a second voltage level for precharging the individual primary capacitors, and the second switching system couples the precharged primary capacitors together, such as to a reference bus, so as to provide the precharged primary capacitance via charge sharing between the precharged primary capacitors and to the reference bus. Alternatively, the second switching system is operable to couple to the reference bus only those precharged primary capacitors that were precharged to the first voltage. In another alternative, the second switching system is operable to couple to the reference bus only those precharged capacitors that were precharged to the second voltage. In yet another alternative, the second switching system is operable to couple to the reference bus selected ones of the primary capacitors that were precharged to either the first or the second voltage.

Another aspect of the invention provides methods for providing bitline reference voltages for memory access operations in a ferroelectric memory device. The method comprises providing a primary capacitance and a plurality of staging capacitances individually associated with a corresponding array column of a ferroelectric memory array. The primary capacitance is charged to a primary precharge voltage during a memory access operation, and the staging capacitances are isolated from the array bitlines. The method further comprises precharging the staging capacitances by coupling the staging capacitances to the precharged primary capacitance while isolating the staging capacitances from the array bitlines, by which the staging capacitances are precharged to a stage precharge voltage. The precharged staging capacitances are then isolated from the primary capacitance after being precharged, and the precharged staging capacitances are then coupled to the individual corresponding array bitlines to provide a reference voltage through charge sharing during the memory access operation. In one implementation, the method may further comprise isolating the staging capacitances from the primary capacitance while charging the primary capacitance and precharging bitlines to Gnd. Where the primary capacitance comprises a plurality of primary capacitors, the charging of the primary capacitance may comprise selectively coupling the individual primary capacitors to one of a first voltage level and a second voltage level for precharging the individual primary capacitors, and coupling the precharged primary capacitors together to provide the precharged primary capacitance.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
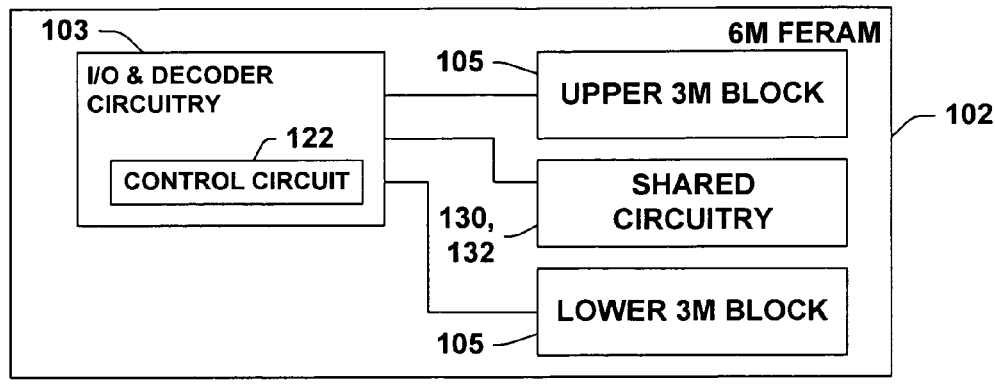
FIG. 1A is a schematic diagram illustrating an exemplary ferroelectric memory device in accordance with one or more aspects of the present invention.
Figure 1B:
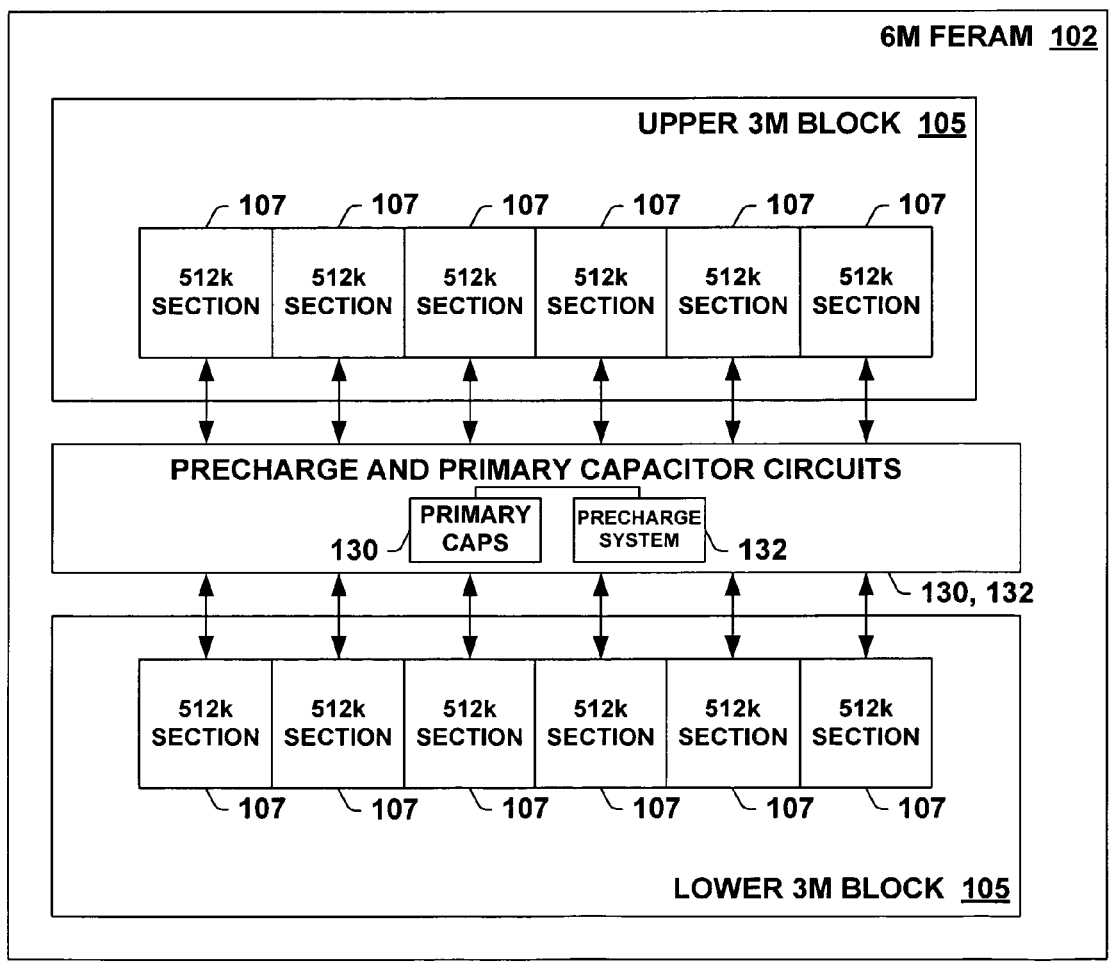
FIG. 1B is a schematic diagram illustrating further details of the memory device of FIG. 1A, in which upper and lower memory array blocks are provided, each having a plurality of sections, together with shared sense amp, precharge, and reference circuitry.

One or more implementations of the present invention will now be described with reference to the attached drawings, wherein like reference numerals are used to refer to like elements throughout. The invention relates to ferroelectric memory devices and reference generators therefor, as well as methods for providing bitline reference voltages for memory access operations in a ferroelectric memory device. One or more exemplary implementations are hereinafter illustrated and described in the context of folded bitline type ferroelectric memory architectures using single transistor-single capacitor (e.g., 1T1C) cells, illustrated in a read operation. However, the invention is not limited to the illustrated implementations, and may alternatively be employed with other cell types and/or in other array architectures (e.g., open bitline, etc.) in which a reference voltage is used during a memory access operation, wherein all such alternate implementations are contemplated as falling within the scope of the invention and the appended claims. Furthermore, the reference systems of the invention may be employed in providing reference voltages in any type of memory access operation in a ferroelectric memory device, including but not limited to read operations. Furthermore, as used herein, the terms "coupled", "coupling", or variants thereof refer to interconnection of various devices or components, and are deemed to include direct connection thereof, as well as to situations where one or more intervening structures or components are connected therebetween.

FIGS. 1A–1H illustrate an exemplary ferroelectric memory device 102 and a reference system thereof in accordance with one or more aspects of the present invention. In the exemplary device 102 illustrated and described below, 1T1C array cells 106 (e.g., the data cells) are coupled with one of a pair of complementary array bitlines associated with an array column in a folded bitline array architecture, with rows of the memory cells being coupled with a corresponding array wordline and a corresponding array plateline. A ferroelectric memory device in accordance with the invention may be any integrated circuit or other structure in which ferroelectric memory cells are employed for storing data or other information. The ferroelectric memory devices of the invention may be employed in any type of applications, such as for storing data and/or program code in personal computer systems, embedded processor-based systems, video image processing circuits, communications devices, etc.

Figure 1C:
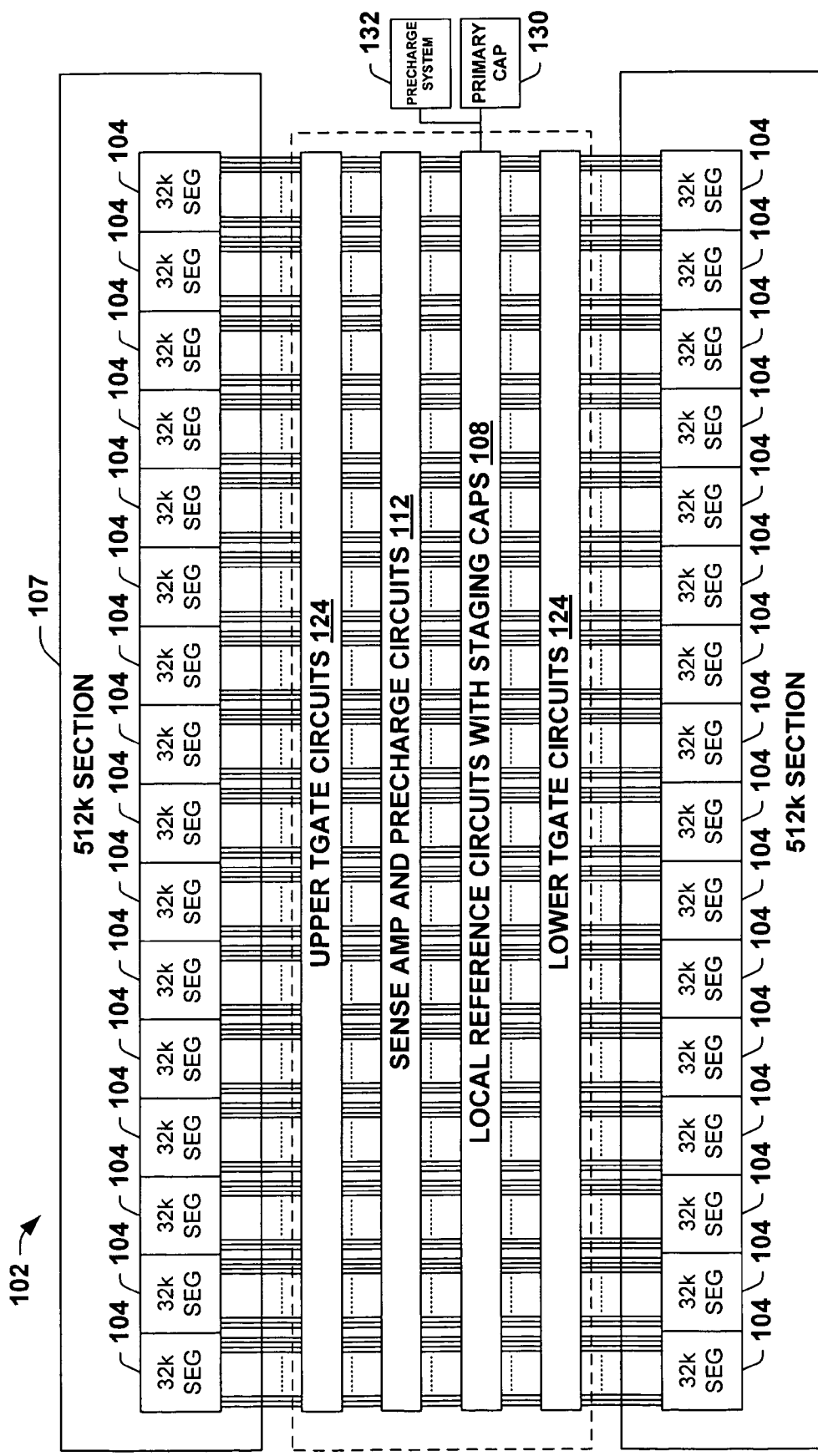
FIG. 1C is a schematic diagram illustrating further details of exemplary upper and lower memory array segments in the device of FIGS. 1A and 1B, each having a plurality of memory segments sharing sense amp and local reference generator circuits.

As illustrated in FIG. 1A, the exemplary device 102 is a 6M ferroelectric memory integrated circuit with I/O and decoder circuitry 103 that comprises a control circuit 122 (FIG. 1F below), as well as two (e.g., upper and lower) 3M memory blocks 105 forming a memory array, and shared circuitry 130, 132 illustrated and described further hereinafter. The memory blocks 105 are further divided into six 512 k sections 107 each, as further illustrated in FIG. 1B. In accordance with the invention, the device 102 also comprises a primary capacitance 130, a precharge system 132, and a plurality of staging capacitances Cs which are part of the 3M arrays 105. As illustrated in FIG. 1C, moreover, each section 107 is divided into 16 segments 104 of 32k each, wherein one such segment 109 is further illustrated in FIGS. 1D and 1E. FIG. 1F illustrates an exemplary control system providing various control and timing signals in the device 102 for read/restore, write, or other memory access operations as described hereinafter. In accordance with one or more aspects of the present invention, the device 102 also comprises a reference generator system comprising a primary capacitance 130, a precharge system 132, and a reference system comprising a plurality of local reference circuits 108 having staging capacitances Cs, as further illustrated in FIGS. 1G and 1H.

Figure 1D:
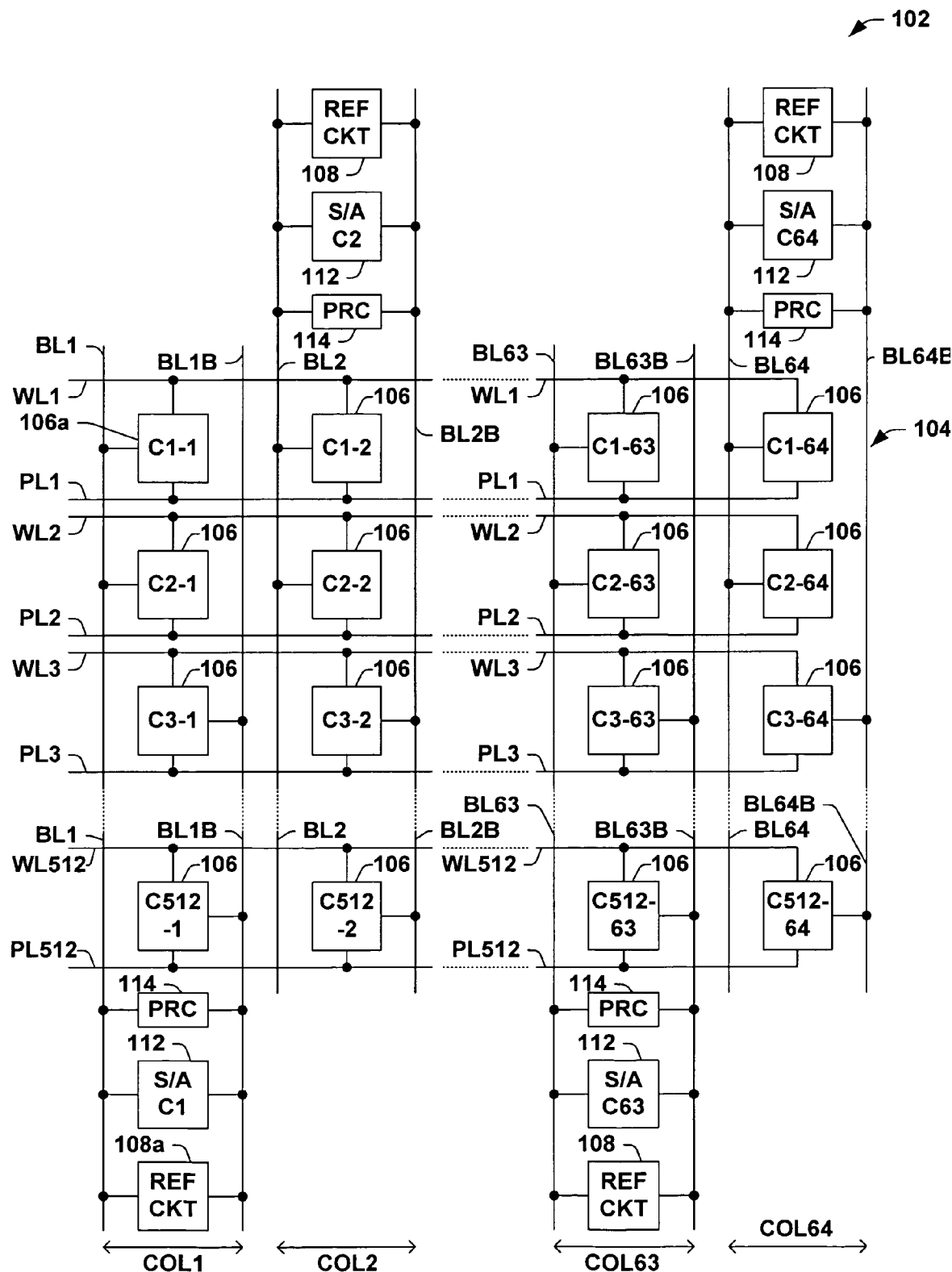
FIG. 1D is a schematic diagram illustrating a portion of an exemplary memory array segment in the device of FIGS. 1A–1C.
Figure 1E:
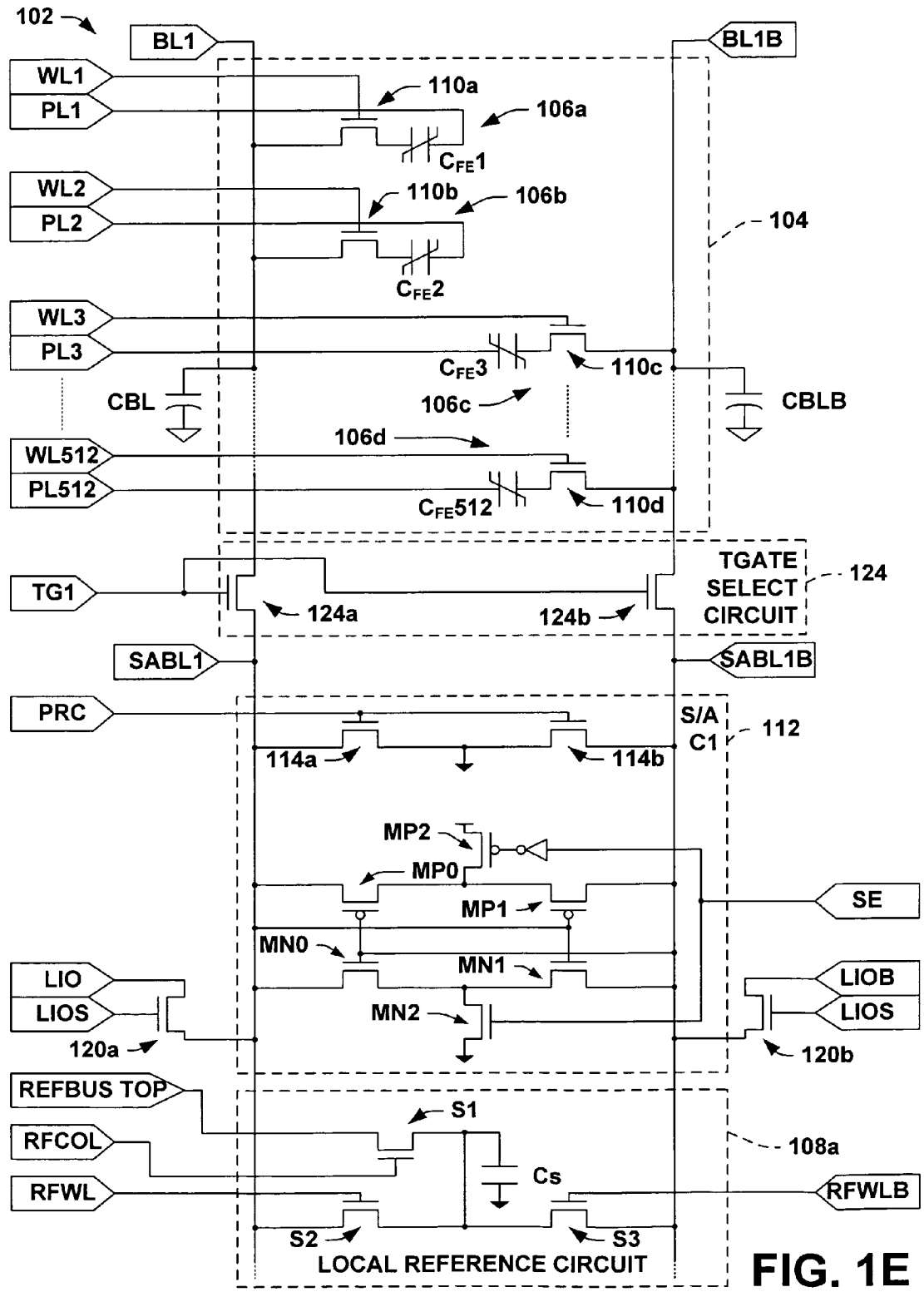
FIG. 1E is a schematic diagram illustrating further details of an exemplary array column in the device of FIGS. 1A–1D, as well as a shared sense amp circuit and a local reference circuit in accordance with the invention.
Figure 1F:
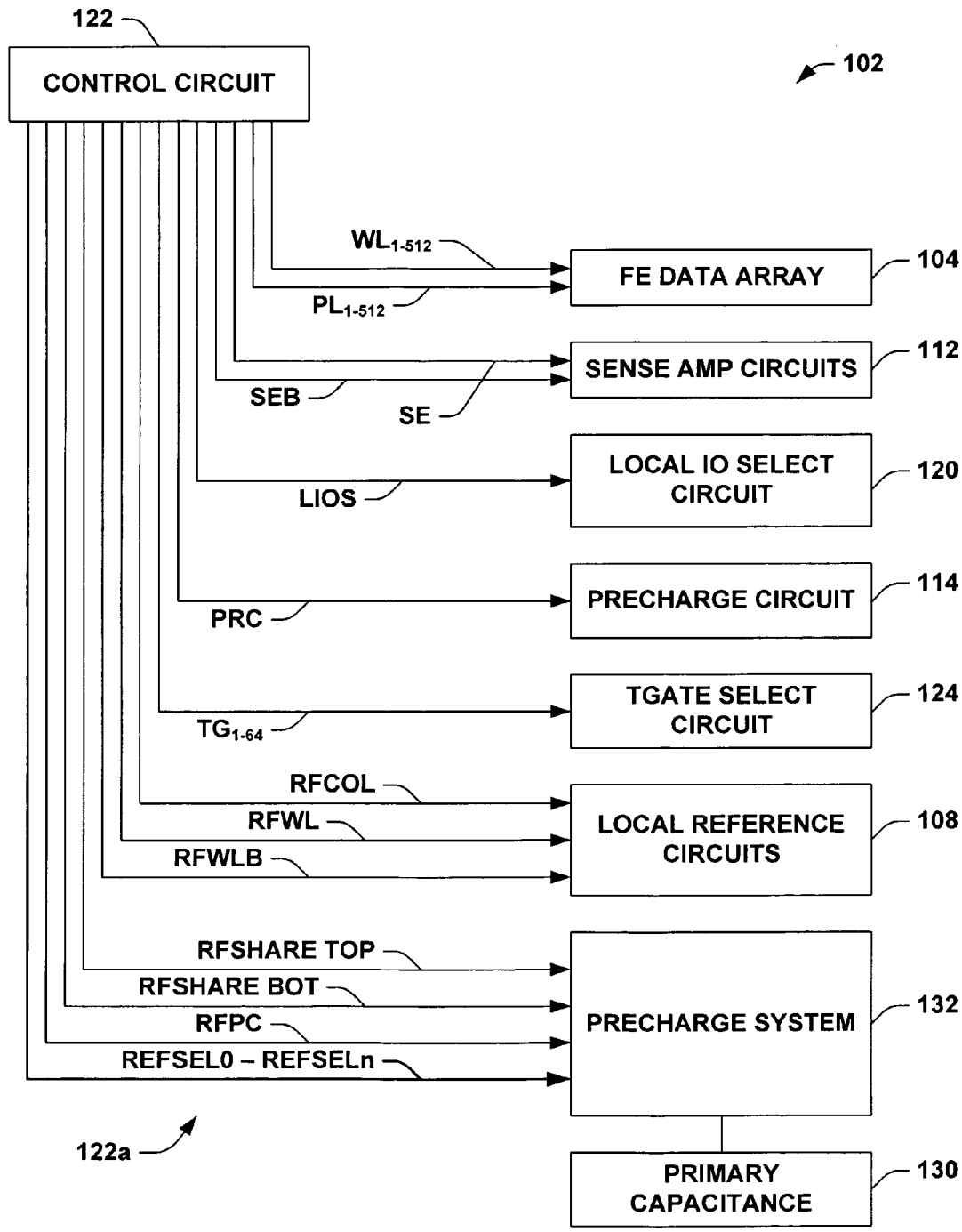
FIG. 1F is a schematic diagram illustrating a control system in the device of FIGS. 1A–1E.

FIG. 1D illustrates a portion of an exemplary memory array segment 104 in the memory device 102, in which 1T1C ferroelectric data memory cells 106 are organized in rows along wordlines WL1–WL512 and columns along the direction of complementary data bitline pairs BL/BLB in a folded bitline configuration, wherein the wordlines WL1–WL512 and other control and timing signals 122a are provided by the control circuit 122 of FIG. 1F. As illustrated in FIGS. 1D and 1E, the exemplary device 102 comprises a folded bitline ferroelectric memory array of cells 106, local reference circuits 108 coupled with the bitlines BL1/BL1B through BL64/BL64B along columns of the array segment 104, and sense amps 112. TGATE select circuits 124 (FIG. 1E) are provided for each column to selectively couple the sense amps 112 and sense amp bitlines SABL/SABLB thereof with bitlines of the illustrated segment 104, thus allowing sharing of the sense amps 112, the precharge circuits 114, and the local reference circuits 108 across multiple array segments 109, although this shared architecture is not a requirement of the invention. In the exemplary array segment 104, the memory cells along WL1 and WL2 (as well as those along WL5, WL6, WL9, WL10, . . . , WL509, WL510) are coupled with bitlines BL1–BL64, whereas cells along WL3 and WL4 (as well as those along WL7, WL8, WL11, WL12, . . . , WL511, WL512) are coupled with the complementary bitlines BL1B–BL64B, although this particular organization is not a requirement of the invention. In reading the first data word along the wordline WL1, the cells C1-1 through C1-64 are connected to the sense amps 112 via the bitlines BL1, BL2 . . . , BL63, and BL64 while the complementary reference bitlines BL1B, BL2B . . . , BL63B, and BL64B are connected to a reference voltage from the local reference circuits 108, where complementary bitlines are used for access to the third row along WL3, where the wordline numbering of the device 102 is exemplary only, and wherein other implementations are possible within the scope of the invention.

FIG. 1E illustrates further details of the first column along the complementary bitline pair BL1/BL1B in the exemplary array segment 104 of FIG. 1D, including an exemplary local reference circuit 108a. Several exemplary ferroelectric memory data cells 106a–106d are illustrated in FIG. 1E comprising ferroelectric capacitors $C_{FE}1$–$C_{FE}512$ and MOS cell access transistors 110a–110d configured in a column along the bitlines BL1 and BL1B. The exemplary ferroelectric segment 104 comprises an integer number "n" of such columns, for example, 64 columns in the illustrated device 102, wherein a number of extra similarly constructed columns (not shown) may be provided in the segment 104 for redundancy (e.g., 2 redundancy columns, for example). The ferroelectric cell capacitors $C_{FE}$ of the array segment 104 may be fabricated from any appropriate ferroelectric material in a wafer, such as Pb(Zr,Ti)O3 (PZT), (Ba,Sr)TiO3 (BST), SrTiO3 (STO), SrBi2Ta2O9 (SBT), BaTiO3 (BTO), (Bi1-xLax) 4Ti3O12 (BLT), or other ferroelectric material fabricated between two conductive electrodes to form a ferroelectric capacitor $C_{FE}$. The data memory cells 106a–106d along the first segment column of FIG. 1E and the contents thereof are accessed during read, restore, and write operations via the complementary array bitlines BL1 and BL1B through activation of the wordline and plateline signals WL1–WL512 and PL1–PL512, respectively, according to the particular row of interest. For example, the ferroelectric capacitor $C_{FE}1$ of the first row is coupled with the bitline BL1 via the first wordline signal WL1 and an access transistor 110a, and the cell capacitor $C_{FE}1$ is accessed via activation of a cell plateline signal (e.g., pulse) PL1 from the control system 122 (FIG. 1F). The following discussion focuses on the interoperation of various components along the first column of the exemplary segment 104, although it will be appreciated that the other array columns and the components thereof operate in a similar fashion, wherein a detailed description of the other columns is omitted for the sake of brevity.

Figure 1G:
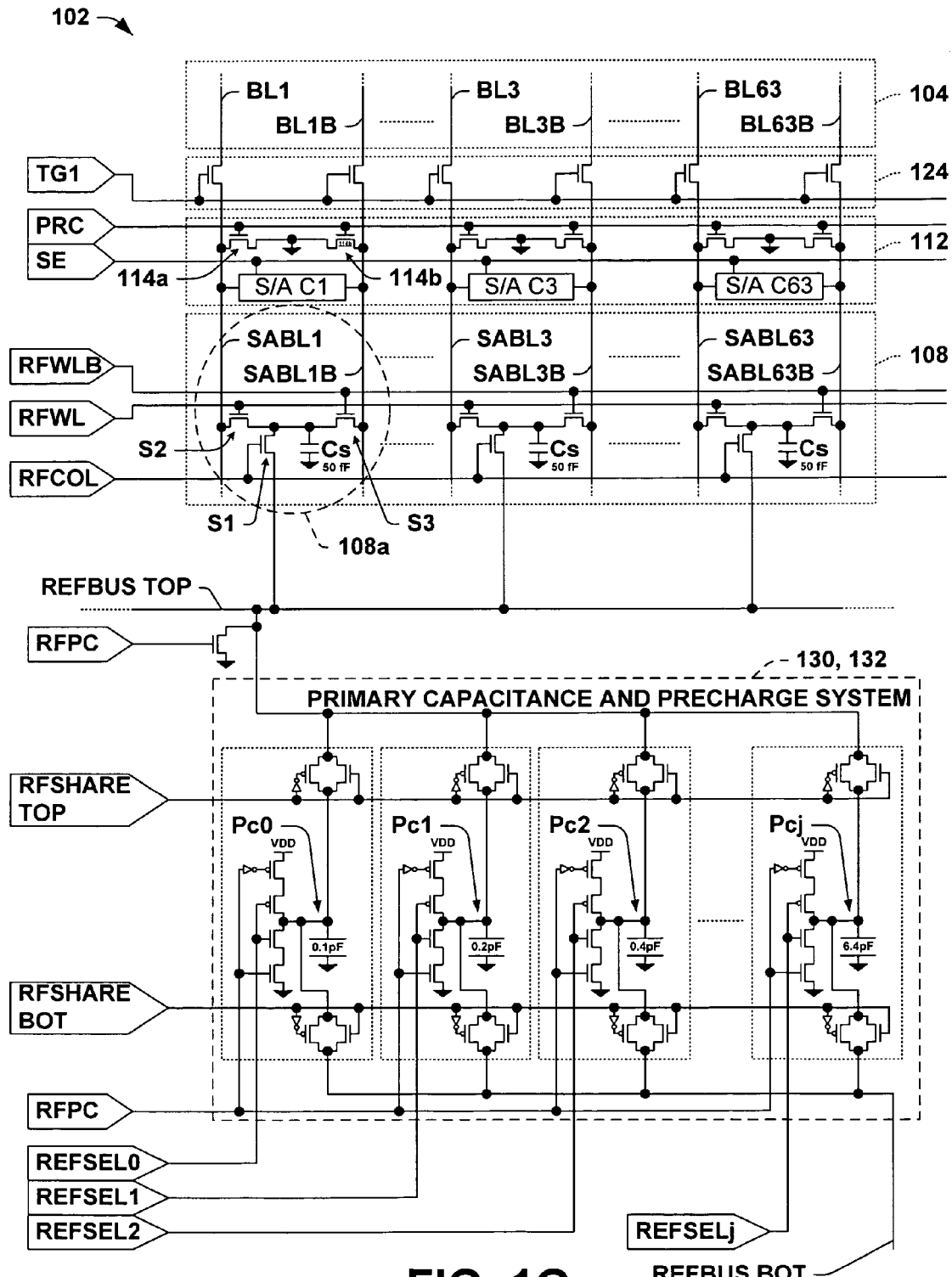
FIG. 1G is a schematic diagram illustrating an exemplary reference generator system in the device of FIGS. 1A–1F in accordance with the invention.

Referring to FIGS. 1E and 1G, in accordance with the invention, the device 102 comprises a reference generator system for providing bitline reference voltages for memory access operations (e.g., read or other operations in which a bitline reference voltage is desired). The exemplary reference generator system of the device 102 comprises primary capacitance 130, a precharge system 132, and a plurality of local reference circuits 108 associated with individual array columns. As illustrated in FIG. 1G, the primary capacitance 130 and the precharge system 132 may be implemented as a single circuit or may alternatively be separate circuits or systems within the scope of the invention. The exemplary primary capacitance 130 comprises an integer number "j" primary capacitors Pc0 through Pcj, which can be any type of capacitor including ferroelectric or non-ferroelectric types. The primary capacitors Pc are binary weighted, wherein Pc0 has a value of 0.1 pF, Pc1 is 0.2 pF, Pc2 is 0.4 pF, . . . , and Pcj is 6.4 pF, although the number 'j' primary capacitors and the binary weighting thereof are not requirements of the invention. As illustrated in FIG. 1G, the exemplary precharge system 132 comprises MOS transistor switching devices operative to charge the primary capacitance 130 to a primary precharge voltage during a memory access operation, such as a read operation, and to couple the precharged primary capacitance 130 to one of two reference busses, REFBUS TOP and REFBUS BOT for charge sharing with staging capacitances Cs of certain of the local reference circuits 108 as described further below.

Any suitable circuitry or components may be employed in fabricating a precharge system in accordance with the invention for precharging the primary capacitance 130 to the primary precharge voltage. The exemplary precharge system 132 in the device 102 comprises first and second switching systems coupled with the primary capacitors Pc, wherein the switching systems in this case are fabricated using NMOS and PMOS transistors. The first switching system includes switching devices operable according to a reference precharge signal RFPC and reference select or trim control signals REFSEL0, REFSEL1, REFSEL2, . . . , REFSELj from the control system 122 (FIG. 1F) to couple the individual primary capacitors Pc to either a first voltage level or a second voltage level for precharging the individual primary capacitors Pc. A second switching system is provided, which is coupled with the primary capacitors Pc, where the second switching system is adapted to couple the precharged primary capacitors Pc together to provide the precharged primary capacitance 130. The second switching system operates according to control signals RFSHARETOP and RFSHAREBOT to selectively couple the individual precharged primary capacitors Pc to one of the upper and lower reference busses REFBUS TOP and REFBUS BOT. This connection of the precharged primary capacitors Pc to one of the busses REFBUS TOP or REFBUS BOT effectively couples the precharged capacitors Pc to one another, whereby charge sharing occurs amongst the capacitances of the binary weighted precharge capacitors Pc and that of the selected reference bus, by which the primary capacitance 130 acquires a primary precharge voltage prior to connection to the local reference circuits 108 (e.g., the primary capacitance 130 as a whole, including the reference bus, becomes precharged). In this manner, the reference select or trim signals REFSEL0, REFSEL1, REFSEL2, . . . , REFSELj may be selected to set the resulting primary precharge voltage, wherein the control system 122 may dynamically adjust these values, or these may be set during fabrication to account for process variation in construction of the transistors, capacitors, or other components of the device 102, wherein the select signal values REFSEL0, REFSEL1, REFSEL2, . . . , REF may be stored in a non-volatile manner in the device 102 (e.g., such as in the form of e-fuse settings, or in memory registers, or other suitable form).

The exemplary reference system further comprises a plurality of local reference circuits 108 individually associated with a corresponding array column, wherein an exemplary first local reference circuit associated with the first column along BL1/BL1B is specifically designated 108a in FIGS. 1D, 1E, and 1G. The local reference circuits 108 individually comprise a staging capacitance Cs, and a first switching device S1 (e.g., an NMOS transistor in this example) coupled between the staging capacitance Cs and the primary capacitance 130 via the upper reference bus REFBUS TOP and the access transistors of the precharge system 132. The local reference circuits 108 also include a second switching device S2 coupled between the staging capacitance Cs and a bitline (e.g., SABL1 and BL1) of the corresponding array column, wherein the exemplary second switching device S2 is an NMOS transistor. Any type of staging capacitance may be used, such as ferroelectric or non-ferroelectric types, and any types of switching device can be used in the local reference circuits 108 within the scope of the invention, including but not limited to MOS transistors.

In operation, the first switching device S1 selectively couples the staging capacitance Cs to the precharged primary capacitance 130 through the reference bus REFBUS TOP for charge sharing therebetween to precharge the staging capacitance Cs to a stage precharge voltage. In addition, the first switching device S1 isolates the staging capacitance Cs from the bus REFBUS TOP while the primary capacitance 130 is being initially precharged and also after the staging capacitance Cs has been stage precharged (e.g., while the staging capacitance Cs is coupled to one of the sense amp bitlines). The second switching S2 is adapted to isolate the staging capacitance Cs from the bitline while the first switching device couples the staging capacitance to the precharged primary capacitance, and to couple the precharged staging capacitance to the bitline for charge sharing therebetween to provide a reference voltage to the bitline during the memory access operation.

The exemplary local reference circuits 108 individually further comprise a third switching device S3 (e.g., an NMOS transistor in this example) coupled between the staging capacitance Cs and a second bitline (BL1B and SABL1B) of the array column, such that the precharged staging capacitance Cs can be selectively coupled to one of the complementary column bitlines depending on which array row is being accessed. In this regard, a reference voltage is needed on the bitlines BL1B/SABL1B for a read of the first array row along WL1, in which case the third switching device S3 operates to couple the precharged staging capacitance Cs to BL1B/SABL1B during such a read. In another example, a read of the third array row along WL3 requires a reference voltage for BL1/SABL1, wherein the second switching device S2 is employed for coupling the precharged staging capacitance Cs to BL1/SABL1, wherein the devices S2 and S3 are operated in similar fashion depending upon the array row being accessed. In the exemplary device 102, moreover, the local reference circuits 108 and the switching devices S1, S2, and S3 thereof are operated according to control signals RFWL, RFWLB, and RFCOL from the control system 122 of FIG. 1F.

Figure 1H:
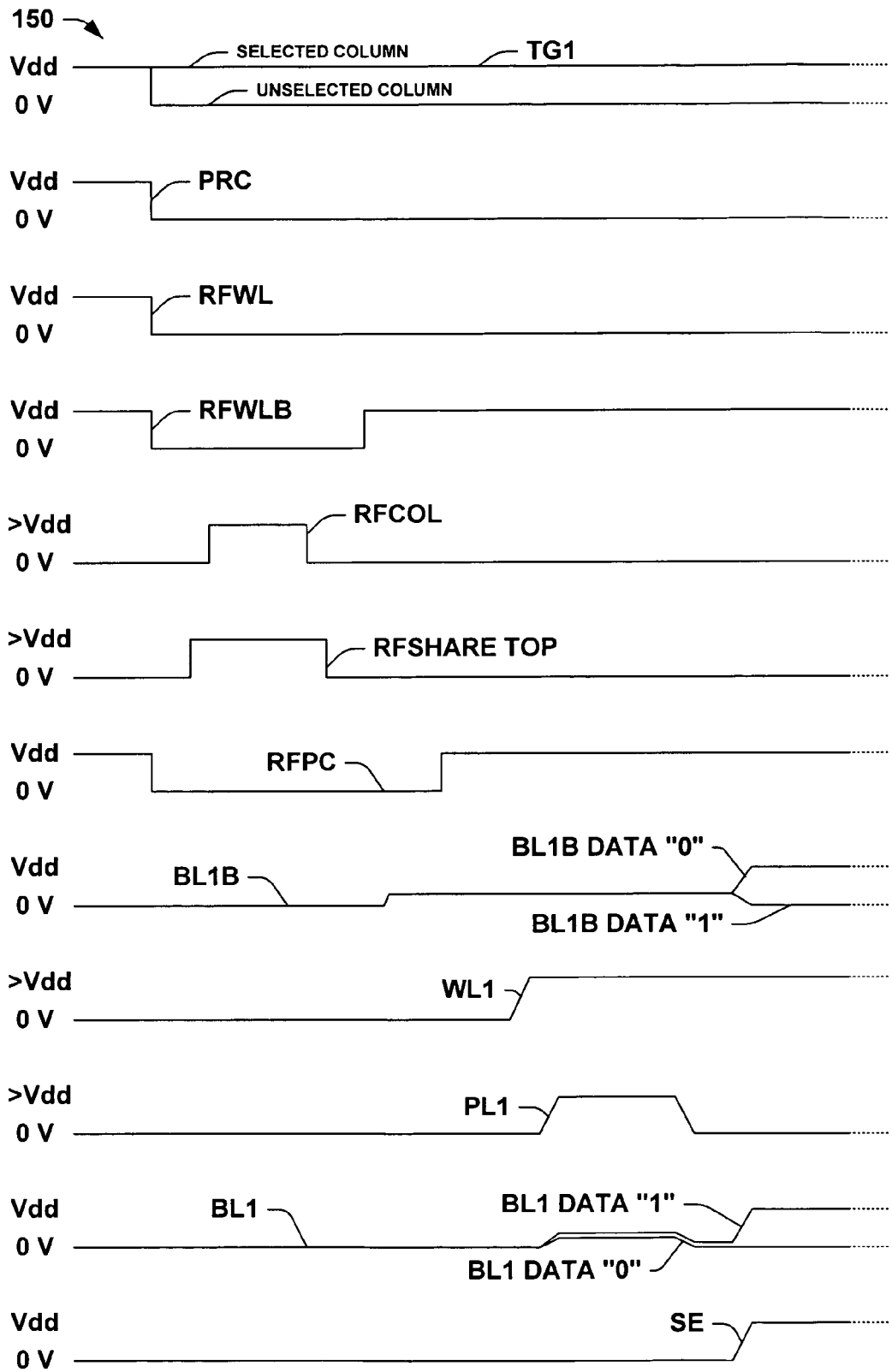
FIG. 1H is an exemplary waveform diagram illustrating operation of the exemplary device of FIGS. 1A–1G during a read operation.

Referring also to FIG. 1H, an exemplary timing diagram 150 is provided to illustrate exemplary operation of the reference generator system of the device 102 during a memory read operation targeting memory cells along the first row of the array segment 104 of FIGS. 1E and 1G. During an initial time period of the read operation, the TGATE circuit 124 operates to couple the shared sense amp bitlines SABL1 and SABL1B with the array column bitlines BL1/BL1B, either or both of the reference wordline signals RFWL and RFWLB are active high to couple the staging capacitor Cs to one or both of the sense amp bitlines SABL1 and SABL1B, the RFCOL signal is held low so as to isolate the local reference circuits 108 (and the staging capacitors Cs thereof) from the reference bus REFBUS TOP (although not strictly required), and the local precharge signal PRC is activated by the control system 122 to precharge the bitlines BL1/BL1B, SABL1/SABL1B and the local staging capacitor Cs to ground (Vss). Also, the control system 122 activates a reference bus precharge signal RFPC to precharge the reference bus REFBUS TOP to Vss. Alternatively, the RFCOL signal can be active high during the precharging of the bitlines and the reference bus. In addition, with the primary capacitance 130 isolated from the staging capacitances Cs and reference busses (e.g., REFCOL low, RFSHARE TOP low, and RFSHARE BOT low), the control system 122 brings the reference precharge signal RFPC high whereby the first switching system of the precharge system 132 selectively couples the individual primary capacitors Pc to either a first voltage level (e.g., supply voltage VDD in the exemplary device 102) or to a second voltage level (e.g., Vss or ground in this example) in order to precharge the individual primary capacitors Pc according to the reference select or trim signals REFSEL0, REFSEL1, . . . , REFSELj from the control system 122.

The reference wordline control signals RFWL and RFWLB are brought low to isolate the staging cap Cs from the sense amp bitlines SABL1 and SABL1B, and the TGATE control signal TG1 is brought low to isolate the sense amp bitlines SABL1 and SABL1B from the unselected array bitlines BL1 and BL1B. With the individual primary capacitors having been precharged, the reference precharge signal RFPC is brought low, and one of the reference busses is coupled with the primary capacitors Pc. In the illustrated example, the control system 122 brings the RFSHARE TOP signal high to couple the precharged primary capacitors Pc to one another and to the upper reference bus REFBUS TOP to provide the precharged primary capacitance 130, which is charged to a primary precharge voltage through charge sharing among the capacitors Pc and the capacitance of the reference bus REFBUS TOP. With RFSHARE TOP remaining active high, the first switching devices S1 of the local reference circuits 108 are activated via the control signal RFCOL (e.g., active high in this example), whereby the switching devices S1 couple the staging capacitances Cs to the precharged primary capacitance 130 for charge sharing therebetween to precharge the staging capacitances Cs to a stage precharge voltage. It is noted that since the individual staging capacitances Cs are all precharged together, the resulting reference voltages in the individual columns will be the same or similar during memory read operations, subject only to array bitline capacitance variations in the array segment 104. The first switching devices S1 then isolate the precharged staging capacitances Cs from the primary capacitance 130 through the control system 122 bringing the RFCOL signal low again during the memory access operation, as shown in FIG. 1H.

While the staging capacitances Cs are being thus precharged through charge sharing with the primary capacitance 130, the second and third switching devices S2 and S3, respectively, of the local reference circuits are turned off (e.g., signals RFWL and RFWLB held low) to isolate the staging cap Cs from the sense amp bitlines SABL1 and SABL1B and from the array bitlines BL1 and BL1B while the first switching device S1 couples the staging capacitance Cs to the precharged primary capacitance 130. For each column, once the staging capacitance Cs has been precharged, the second switching device S2 or the third switching device S3 is activated to couple the precharged staging capacitance Cs to the corresponding sense amp bitline and the raised TGATE signal TG1 couples the staging capacitor Cs to the corresponding array bitline for charge sharing therebetween to provide a reference voltage during the memory access operation. In the illustrated example, the data is being accessed along BL1, and the signals RFWLB is brought high (TG1 already high) to couple the staging capacitor Cs to the array bitline BL1B to provide a reference voltage thereon using the corresponding switching device S3, as illustrated in FIG. 1H. Alternatively, where the data is being accessed on BL1B, the switching device S2 is used to couple the precharged staging capacitor Cs to the array bitline BL1.

It is noted that the staging capacitance Cs is isolated from the primary capacitance 130 via the first switching device S1 during the time that the precharged staging capacitance Cs is coupled with the array bitline, whereby shorting or other problems that may occur with a given array bitline do not disturb the reference voltage applied to other bitlines during memory access operations. In addition, because the local staging capacitances are precharged together, the reference voltages on the array bitlines are generally uniform. Furthermore, the reference generator system of the invention facilitates reduced circuit area compared with dedicated reference generator schemes.

Continuing with the example of FIG. 1H, cell data is read from the exemplary cells 106 along the first wordline WL1 and the bitlines BL1, BL2, . . . , BL64, with a reference voltage being applied to the complementary bitlines BL1B, BL2B, . . ., BL64B via charge sharing between the precharged staging capacitors Cs and the array bitlines BL1B, BL2B, . . . , BL64B. The wordline for the target row is activated (e.g., WL1 in this example), and the plateline PL1 is brought to VDD or some other positive voltage, thereby creating a voltage across the cell capacitor $C_{FE}1$. It is noted that although the wordline WL1 is shown rising in FIG. 1H after the reference voltage has been established on BL1B, the wordline and plateline signals may begin earlier, wherein the timing of these signals is not critical to the invention. The plateline signal PL1 is brought low again (e.g., before or after enabling the sense amp 112). In the illustrated implementation, the plateline goes low prior to the sense amp being enabled via the control signal SE to latch the data in the form of a differential voltage on the sense amp bitlines SABL/SABLB, which is then transferred to local IO circuitry along local IO lines LIO/LIOB via local IO select transistors 120a and 120b (FIG. 1E) according to a control signal LIOS from the control system 122. As illustrated in FIG. 1E, the exemplary sense amp 112 along the first array column bitlines BL1 and BL1B comprises NMOS transistors MN0, MN1, and MN2 as well as PMOS transistors MP0, MP1, and MP2. The sense amp 112 is enabled via the sense amp enable signal SE provided by the control circuit 122 to the sense amp transistors MN2 and MP2, respectively.

The reference generator system of the invention creates a reference voltage on the complementary bitlines that is between the "0" and "1" state voltage levels obtained by applying the plateline pulse to the cell capacitors $C_{FE}$. This creates a differential voltage at the input terminals of the sense amp 112 (e.g., sense amp bitlines SABL1 and SABL1B), the polarity of which indicates the data stored in the target data cell 106. In the pulse sensing example of FIG. 1H, the cell plateline PL1 is brought low (e.g., deactivated) before the sense amp 112 is enabled via the SE signal from the control system 122 to begin the data sensing operation. Alternatively, step sensing may be employed, wherein the sense amp enable signal SE is brought high prior to deactivating the array plateline signal PL1 (e.g., prior to bringing PL1 low).

Figure 2:
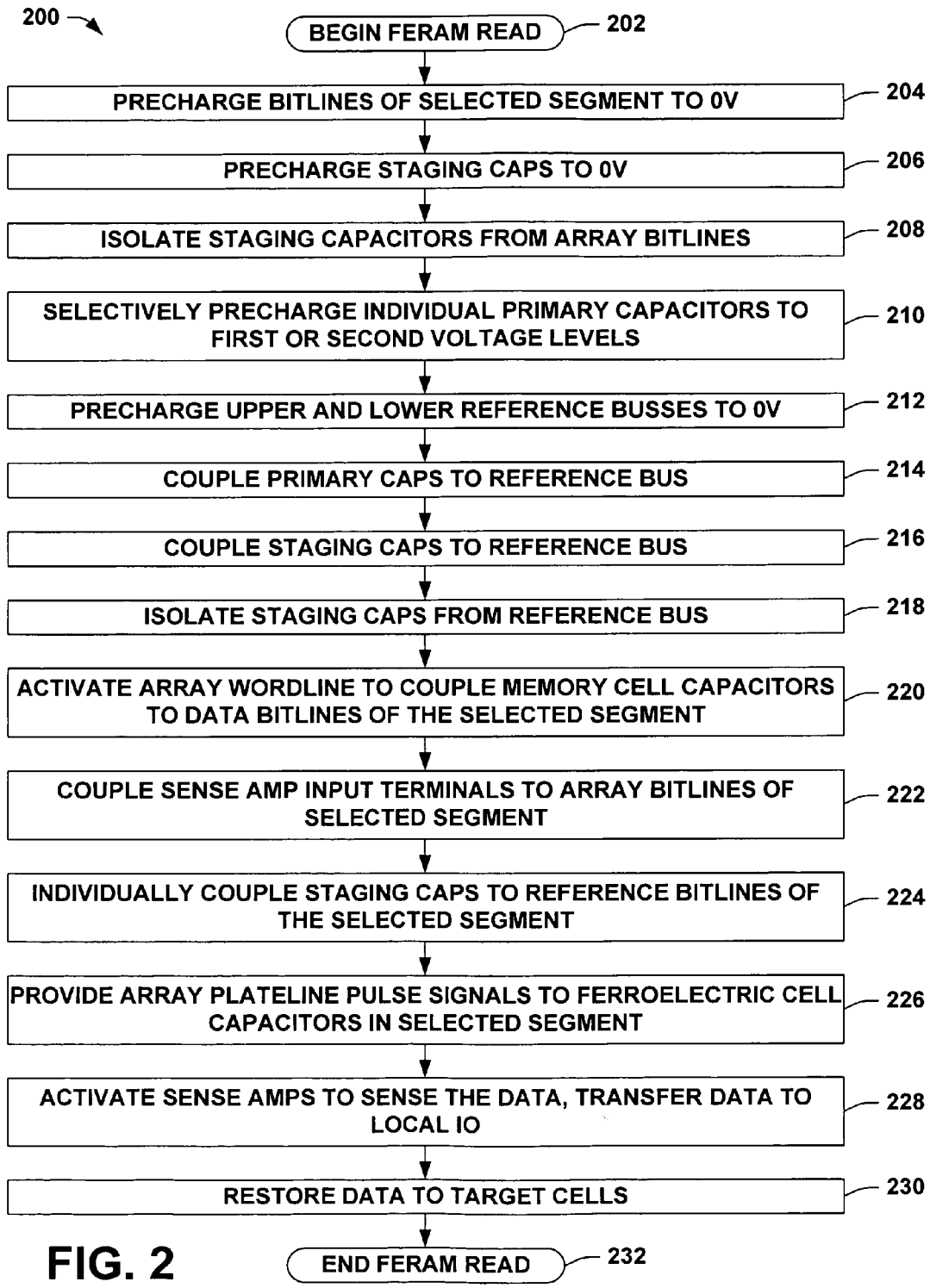
FIG. 2 is a flow diagram illustrating an exemplary method of providing a reference voltage in a ferroelectric memory device in accordance with the invention.

Referring now to FIG. 2, an exemplary method 200 is illustrated for reading ferroelectric memory data, which may be carried out in the exemplary device 102 or other ferroelectric memory devices of the invention. Although the method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. For example, the word line activation and plate line pulse may occur before RFWL(B) activation, as well as other variations.

In one example (not shown) the first switching device 108 couples the staging capacitance to the primary capacitance while the precharge system 132 charges the primary capacitance 130 so that both the staging capacitances and the primary capacitance are precharged concurrently. The stage precharge voltage thus achieved is not expected to vary from the exemplary case described above wherein the first switching device isolates the primary capacitance 130 from the staging capacitance while the primary capacitance 130 is being precharged by the precharge system 132. In the example, the precharge primary voltage and the precharge stage voltage could be considered the same and used interchangeably.

The precharge system 132 may also be varied (not shown) compared to the exemplary circuit shown in the FIG. 1G. In one such variation only the selected primary capacitors that are precharged to a first voltage level are coupled to the reference bus, or only the primary capacitors that are precharged to a second voltage level are coupled to the reference bus, as may be desired. In yet another alternative, the circuit may couple selected ones of the primary capacitors that have been precharged to either the first or second voltage level.

In addition, not all illustrated steps may be required to implement a methodology in accordance with the present invention. The methods of the present invention, moreover, may be implemented in association with the devices illustrated and described herein as well as in association with other devices and systems not illustrated. For example, the exemplary method 200 may be employed in providing reference voltages during read or other memory access operations in the exemplary ferroelectric memory device 102 of FIGS. 1A–1H above.

Beginning at 202, array bitlines in a ferroelectric memory array are precharged at 204 to 0V (e.g., VSS). For example, in the illustrated device 102 above, the array bitline BL1 is precharged to ground (e.g., 0 V) via assertion of the PRC signal by the control system 122. At 206, the staging capacitors are also precharged to 0V, for example, by coupling the staging capacitors Cs to the array bitlines via the RFWL/RFWLB, and TG1 signals while the PRC signal is active in the exemplary device 102. The staging capacitors are then isolated from the array bitlines at 208, for example, by deactivating the second and third switching devices S2 and S3 (e.g., via signals RFWL and RFWLB). At 210–214, a primary capacitance (e.g., capacitance 130 in the device 102) is charged to a primary precharge voltage. In the case of a plurality of primary capacitors, as in the device 102 above, the individual primary capacitors Pc are precharged at 210 to first or second voltage levels, and the reference busses are precharged to 0V at 212. At 214, the precharged primary capacitors Pc are coupled together and to a reference bus (e.g., coupled to REFBUS TOP via signal RFSHARE TOP in FIG. 1G), to provide the precharged primary capacitance 130. The staging capacitances Cs are then coupled to the reference bus at 216 (e.g., via the first switching devices S1 and the control signal RFCOL) to cause charge sharing between the primary and staging capacitances. This precharges the staging capacitances Cs to a stage precharge voltage, and then the staging capacitances Cs are isolated from the reference bus (e.g., and hence from one another and from the primary capacitance 130) at 218, by turning the first switching devices S1 off using the signal RFCOL.

An array wordline (e.g., WL1 in the above example) is activated at 220 to couple the targeted ferroelectric cell capacitors with the array data bitline, and the input terminals of the sense amps (e.g., sense amp bitlines SABL and SABLB) are coupled to the array bitlines BL and BLB, for example, using the already activated TG1 signal and transistors 124a and 124b in FIG. 1E. At 224, the precharged staging capacitances Cs are individually coupled to the reference bitlines of the corresponding array columns, using either the second or third switching devices (S2 or S3) of the local reference circuits 108 according to the signals RFWL or RFWLB. At 226, an array plateline pulse signal is applied to create a voltage across the ferroelectric cell capacitors $C_{FE}$, and the sense amps 112 are enabled at 228 to sense the data, after which the read data is transferred from the sense amps 112 to local IO. The read data is then restored from the sense amps 112 to the target cells 106 along the accessed wordline at 230, and the read operation 200 ends at 232.

The invention is equally applicable to the array architecture wherein one plate line couples with ferro-capacitors associated with one wordline as well as with the common plateline architecture wherein a plateline couples with ferro-capacitors associated with several wordlines.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A reference generator system for providing bitline reference voltages for memory access operations in a ferroelectric memory device, the reference generator system comprising:

a primary capacitance;
a precharge system coupled with the primary capacitance, the precharge system being adapted to charge the primary capacitance before or during a memory access operation; and
a reference system comprising a plurality of local reference circuits individually associated with a corresponding array column of a ferroelectric memory array, the local reference circuits individually comprising:
   a staging capacitance;
   a first switching device coupled between the staging capacitance and the primary capacitance, the first switching device being adapted to couple the staging capacitance to the primary capacitance for charge sharing therebetween to precharge the staging capacitance and to then isolate the precharged staging capacitance from the primary capacitance before or during the memory access operation; and
   a second switching device coupled between the staging capacitance and a bitline of the corresponding array column, the second switching device being adapted to isolate the staging capacitance from the bitline while the first switching device couples the staging capacitance to the primary capacitance to precharge the staging capacitance, and to couple the precharged staging capacitance to the bitline for charge sharing therebetween to provide a reference voltage to the bitline before or during the memory access operation.

2. The reference generator system of claim 1, wherein the first switching device being further adapted to isolate the staging capacitance from the primary capacitance while the precharge system charges the primary capacitance.

3. The reference generator system of claim 1, wherein the primary capacitance comprises a plurality of primary capacitors.

4. The reference generator system of claim 3, wherein the precharge system comprises:
   a first switching system coupled with the primary capacitors, the first switching system being adapted to selectively couple the individual primary capacitors to one of a first voltage level and a second voltage level for precharging the individual primary capacitors, thereby resulting in a first set of capacitors charged to the first voltage level and a second set of capacitors charged to the second voltage level; and
   a second switching system coupled with the primary capacitors, the second switching system being adapted to couple the first set of the precharged primary capacitors together, the second set of the precharged primary capacitors together, or selective ones of the first and second of the precharged primary capacitors together to provide charge to the primary capacitance.

5. The reference generator system of claim 4, further comprising a reference bus coupled between the second switching system and the first switching devices.

6. The reference generator system of claim 1, further comprising a reference bus coupled between the primary capacitance and the first switching devices.

7. The reference generator system of claim 1, wherein the second switching devices of the individual local reference circuits are coupled between the staging capacitance and a first bitline of the corresponding array column, wherein the local reference circuits individually comprise a third switching device coupled between the staging capacitance and a second bitline of the corresponding array column, and wherein the second and third switching devices of the individual local reference circuits are adapted to isolate the staging capacitance from the first and second bitlines while the first switching device couples the staging capacitance to the primary capacitance to precharge the staging capacitance, and to selectively couple the precharged staging capacitance to one of the first and second bitlines for charge sharing therebetween to provide a reference voltage on the one of the first and second bitlines before or during the memory access operation.

8. The reference generator system of claim 1, wherein the staging capacitance is non-ferroelectric.

9. The reference generator system of claim 1, wherein the primary capacitance is non-ferroelectric.

10. A ferroelectric memory device, comprising:
an array of ferroelectric memory cells arranged in rows along a wordline direction and columns along a bitline direction, the ferroelectric memory cells individually comprising a ferroelectric cell capacitor having first and second terminals and a cell transistor adapted to selectively couple the first cell capacitor terminal to one of a pair of array bitlines associated with a corresponding array column according to an array wordline, wherein the cell transistors along array rows are coupled with a corresponding array wordline and the second cell capacitor terminals along array rows are coupled with a corresponding array plateline;
a primary capacitance;
a precharge system coupled with the primary capacitance, the precharge system being adapted to charge the primary capacitance before or during a memory access operation; and
a reference system comprising a plurality of local reference circuits individually associated with a corresponding array column, the local reference circuits individually comprising:
a staging capacitance;
a first switching device coupled between the staging capacitance and the primary capacitance, the first switching device being adapted to couple the staging capacitance to the primary capacitance for charge sharing therebetween to precharge the staging capacitance to a stage precharge voltage, and to then isolate the precharged staging capacitance from the primary capacitance before or during the memory access operation; and
a second switching device coupled between the staging capacitance and a bitline of the corresponding array column, the second switching device being adapted to isolate the staging capacitance from the bitline while the first switching device couples the staging capacitance to the primary capacitance to precharge the staging capacitance, and to couple the precharged staging capacitance to the bitline for charge sharing therebetween to provide a reference voltage to the bitline before or during the memory access operation.

11. The ferroelectric memory device of claim 10, wherein the first switching device being further adapted to isolate the staging capacitance from the primary capacitance while the precharge system charges the primary capacitance.

12. The ferroelectric memory device of claim 10, wherein the primary capacitance comprises a plurality of primary capacitors.

13. The ferroelectric memory device of claim 12, wherein the precharge system comprises:
a first switching system coupled with the primary capacitors, the first switching system being adapted to selectively couple the individual primary capacitors to one of a first voltage level and a second voltage level for precharging the individual primary capacitors, thereby resulting in a first set of capacitors charged to the first voltage level and a second set of capacitors charged to the second voltage level; and
a second switching system coupled with the primary capacitors, the second switching system being adapted to couple the first set of the precharged primary capacitors together, the second set of the precharged primary capacitors together, or selective ones of the first and second precharged primary capacitors together to provide charge to the primary capacitance.

14. The ferroelectric memory device of claim 13, further comprising a reference bus coupled between the second switching system and the first switching devices.

15. The ferroelectric memory device of claim 10, further comprising a reference bus coupled between the primary capacitance and the first switching devices.

16. The ferroelectric memory device of claim 10, wherein the second switching devices of the individual local reference circuits are coupled between the staging capacitance and a first bitline of the corresponding array column, wherein the local reference circuits individually comprise a third switching device coupled between the staging capacitance and a second bitline of the corresponding array column, and wherein the second and third switching devices of the individual local reference circuits are adapted to isolate the staging capacitance from the. first and second bitlines while the first switching device couples the staging capacitance to the primary capacitance to precharge the staging capacitance, and to selectively couple the precharged staging capacitance to one of the first and second bitlines for charge sharing therebetween to provide a reference voltage on the one of the first and second bitlines before or during the memory access operation.

17. The ferroelectric memory device of claim 10, wherein the staging capacitance is non-ferroelectric.

18. The ferroelectric memory device of claim 10, wherein the primary capacitance is non-ferroelectric.

19. A method of providing bitline reference voltages for memory access operations in a ferroelectric memory device, the method comprising:
providing a primary capacitance;
providing a plurality of staging capacitances individually associated with a corresponding array column of a ferroelectric memory array;
charging the primary capacitance before or during a memory access operation;
isolating the staging capacitances from the array bitlines;
precharging the staging capacitances by coupling the staging capacitances to the primary capacitance while isolating the staging capacitances from the array bitlines to precharge the staging capacitances to a stage precharge voltage;
isolating the precharged staging capacitances from the primary capacitance after precharging the staging capacitances; and
individually coupling the precharged staging capacitances to the bitlines for charge sharing therebetween to provide a reference voltage to the bitlines before or during the memory access operation.

20. The method of claim 19, further comprising isolating the staging capacitances from the primary capacitance while charging the primary capacitance.

21. The method of claim 19, wherein the primary capacitance comprises a plurality of primary capacitors, and wherein charging the primary capacitance comprises selectively coupling the individual primary capacitors to one of a first voltage level and a second voltage level for precharging the individual primary capacitors, and coupling all or selected ones of the precharged primary capacitors together to provide charge to the primary capacitance.

* * * * *